United States Patent [19]

Peller

[11] Patent Number: 5,452,951
[45] Date of Patent: Sep. 26, 1995

[54] ELECTRONIC COMPONENT RACK

[75] Inventor: Hyman H. Peller, Upper Montclair, N.J.

[73] Assignee: Raxxess Metalsmiths Inc., Prospect Park, N.J.

[21] Appl. No.: 183,473

[22] Filed: Jan. 18, 1994

[51] Int. Cl.⁶ ............................................ A47B 88/00
[52] U.S. Cl. ........................ 312/310; 312/223.1; 108/6; 248/461
[58] Field of Search .................. 312/327, 293.1, 312/293.2, 310, 324; 108/39, 33, 9, 6, 1; 248/455, 456, 461

[56] References Cited

U.S. PATENT DOCUMENTS

| | | | |
|---|---|---|---|
| 257,285 | 5/1882 | Brownell | 312/293.2 |
| 2,244,036 | 6/1941 | Willimon et al. | 108/9 |
| 2,515,474 | 7/1950 | Ryder | 108/39 |
| 2,739,859 | 3/1956 | Cohen | 108/33 |
| 2,778,705 | 1/1957 | Barker | 312/310 |
| 2,804,122 | 8/1957 | Baum | 312/314 |
| 4,421,943 | 12/1983 | Withjack | 248/455 |
| 4,592,285 | 6/1986 | Eglijack | 108/9 |
| 4,660,791 | 4/1987 | Lisak . | |

OTHER PUBLICATIONS

Commercial Products Catalog, Middle Atlantic Products–Front and back cover pages, p. 6, 1992 (?).

Primary Examiner—Kenneth J. Dorner
Assistant Examiner—Gerald A. Anderson
Attorney, Agent, or Firm—Lerner, David, Littenberg, Krumholz & Mentlik

[57] ABSTRACT

An apparatus for rack mounting electronic components includes a frame structure defining a storage compartment having a front access opening and a pair of rack rails pivotally mounted to opposite sides of the frame structure for movement between a retracted position in which the rack rails lie entirely within the frame structure and an extended position in which the rack rails project out from the frame structure. Connected between the rack rails and the sides of the frame structure are slide members which are capable of locking the rack rails at the extended position and at a number of discrete angular positions intermediate the extended and retracted positions. With electronic components mounted to the rack rails, pivoting the rack rails from the retracted position to the extended position will provide access to the rear panels of the these components to facilitate the completion of electrical interconnections and maintenance and repair procedures.

32 Claims, 3 Drawing Sheets

ELECTRONIC COMPONENT RACK

FIELD OF THE INVENTION

The present invention relates generally to apparatus for mounting electronic components in stacked relationship, and more particularly to apparatus for rack-mounting electronic components within an enclosure. Still more particularly, the present invention relates to apparatus which enables the rack-mounted audio and video components to be tilted outwardly from the enclosure.

BACKGROUND OF THE INVENTION

The myriad of cooperating electronic components available today has created a need for apparatus which can securely and effectively store these components in stacked relationship, not only so that the components can be electrically interconnected with one another, but so that they can be readily accessed and used. This is particularly true in the entertainment industry in which a large number of individual audio and/or video components are typically used together in order to create desired auditory and visual effects. This need has led manufacturers to standardize the width dimension of these components so that they can be readily assembled in rack mounting systems. Such systems generally consist of some sort of frame structure to which a pair of rack rails are fixedly mounted at an appropriate distance from one another for accepting the electronic components. Each component is then mounted to the rack rails by aligning a pair of apertures or slots on each side of its front face with corresponding apertures in the rack rails and by using bolts or other such fasteners to complete the assembly. These rack mounting systems are extant both in the form of rather large open systems permanently installed in homes and commercial establishments, and in the form of relatively small boxes which fully enclose the components to protect same from damage due to dirt and mishandling, and which are readily transportable by musicians, disc jockeys, and other entertainers for use at remote locations.

The problem with conventional rack mounting systems is that once the electronic components are mounted therein, it is difficult to gain access to the rear of the components to make the appropriate electrical connections, to disconnect the electrical connections so that a particular component can be removed, and to perform other maintenance and repair procedures. Presently, this access is provided by manufacturing these rack mounting systems without back panels or with back panels which are removable. This solution, however, is not always helpful. For example, in rack mounting systems which are installed in or against a wall or other such structure, the rear of the system is simply inaccessible without making costly building modifications to provide such access. In the smaller, transportable box systems, the need for a removable rear panel increases the size and cost of these units.

There therefore exists a need for a rack mounting system which will securely hold electronic components in stacked relationship, yet which will permit the rear of the components to be readily accessed so that electrical connections, maintenance, repairs and other such procedures can be easily performed. There further exists a need for a rack mounting system which will provide this capability in the form of a portable unit which will protect the electronic components as they are transported from one location to another.

SUMMARY OF THE INVENTION

These needs have now been addressed by the invention of an apparatus which enables electronic components mounted within an enclosure to be tilted out from the enclosure, whereby access to the rear of the components is always available for making electrical interconnections and for performing maintenance and repair procedures. In accordance with one embodiment of the invention, the apparatus may consist of a housing defining a cavity and a front opening plane. Rail means for mounting electronic components to the housing are connected to the housing for pivotal movement about an axis extending parallel to the opening plane between a retracted position in which the rail means lie entirely within the housing and an extended position in which the rail means project out from the housing at an angle to the opening plane. In the retracted position, the rail means may lie adjacent the opening plane.

The rail means may include first and second rail members which are connected to opposite sides of the housing and which are independently movable about first and second axes between the retracted and extended positions. Preferably, the first and second axes are aligned coaxially. More preferably, the first and second rail members may be spaced apart by a standard distance for receiving electronic audio and video components therebetween.

In a preferred embodiment, a rear panel is connected to the housing so that the housing is in the form of a box. Preferably, a cover is connectable to the housing over the front opening to fully enclose the cavity within the box. The portability of the apparatus may be facilitated by handle means connected to the housing for carrying the housing from one location to another.

Fastening means enable the electronic components to be fastened to the rail means. Preferably, the fastening means include a plurality of threaded apertures positioned at preselected spaced intervals along the length of the rail means.

The positioning of the rail means may be determined by an operating mechanism which includes means for locking the rail means in the extended position and for releasing the rail means for movement to the retracted position. Preferably, the operating mechanism further includes means for locking the rail means at one of a plurality of discrete angular positions intermediate the extended and retracted positions. More preferably, and as a safety feature to prevent the accidental or inadvertent release of the rail means from the extended position or from one of the intermediate angular positions, the rail means are releasable for movement to the retracted position only from a release position which is beyond the extended position.

In a preferred embodiment, the operating mechanism may include a first arm having one end pivotally connected to the housing and a free end, and a second arm having one end pivotally connected to the rail means and a free end, wherein the free ends of the first and second arms are connected for sliding movement relative to one another between a retracted condition when the rail means is in the retracted position and an extended condition when the rail means is in the extended position. In such arrangement, the operating mechanism may further include means for locking the first arm relative to the second arm at one of a plurality of discrete conditions intermediate the extended and retracted conditions.

In accordance with another embodiment the apparatus may consist of a first housing defining a storage space and a front opening to the storage space lying in a predetermined opening plane and a second housing connected to the first housing and defining a cavity and an opening to the cavity lying in a preselected opening plane. Preferably, the preselected opening plane is oriented at an angle to the predetermined opening plane. This angle is desirably about 90°. Still more preferably, the apparatus includes passage means for providing communication between the storage space and the cavity. A handle connected to the apparatus enables the apparatus to be carried in a portable fashion.

Mounting means for mounting the electronic components to the first housing may include a pair of rail members connected to opposite sides of the first housing adjacent the predetermined opening plane. Preferably, these mounting means also include assembling means for assembling the electronic components to the rail members.

Rail means for mounting the electronic components to the second housing are connected to the second housing for pivotal movement about an axis extending parallel to the preselected opening plane between a retracted position in which the rail means lie entirely within the second housing and an extended position in which the rail means project out from the second housing at an angle to the preselected opening plane. In a preferred embodiment, the rail means may include first and second rail members which are connected to opposite sides of the second housing and which are independently movable between the retracted and extended positions. An operating mechanism may lock the rail members in the extended position and release the rail members for movement to the retracted position.

Preferred apparatus in accordance with the present invention enables rack-mountable electronic components to be mounted in a conventional fashion within a frame structure, but permits the components in the mounted condition to be tilted out from the frame structure so that the rear of the components can be readily accessed for making electrical interconnections and for performing maintenance and repair procedures. This improved access is particularly beneficial in systems where access to the rear of the components would not ordinarily be available, such as "built-in" installations in homes and commercial establishments, relatively large, immovable installations placed against a wall, or portable systems in which the components are fully enclosed by a protective cabinet. In addition to the foregoing benefit, preferred apparatus in accordance with the present invention enhances the ability to view the components from different angles and enables a number of components to be assembled in a smaller size enclosure than was previously possible with prior art systems.

BRIEF DESCRIPTION OF THE DRAWINGS

A more complete appreciation of the subject matter of the present invention and the various advantages thereof can be realized by reference to the following detailed description, in which reference is made to the accompanying drawings in which.

DETAILED DESCRIPTION OF THE PREFERRED EMBODIMENTS

Figure 1:
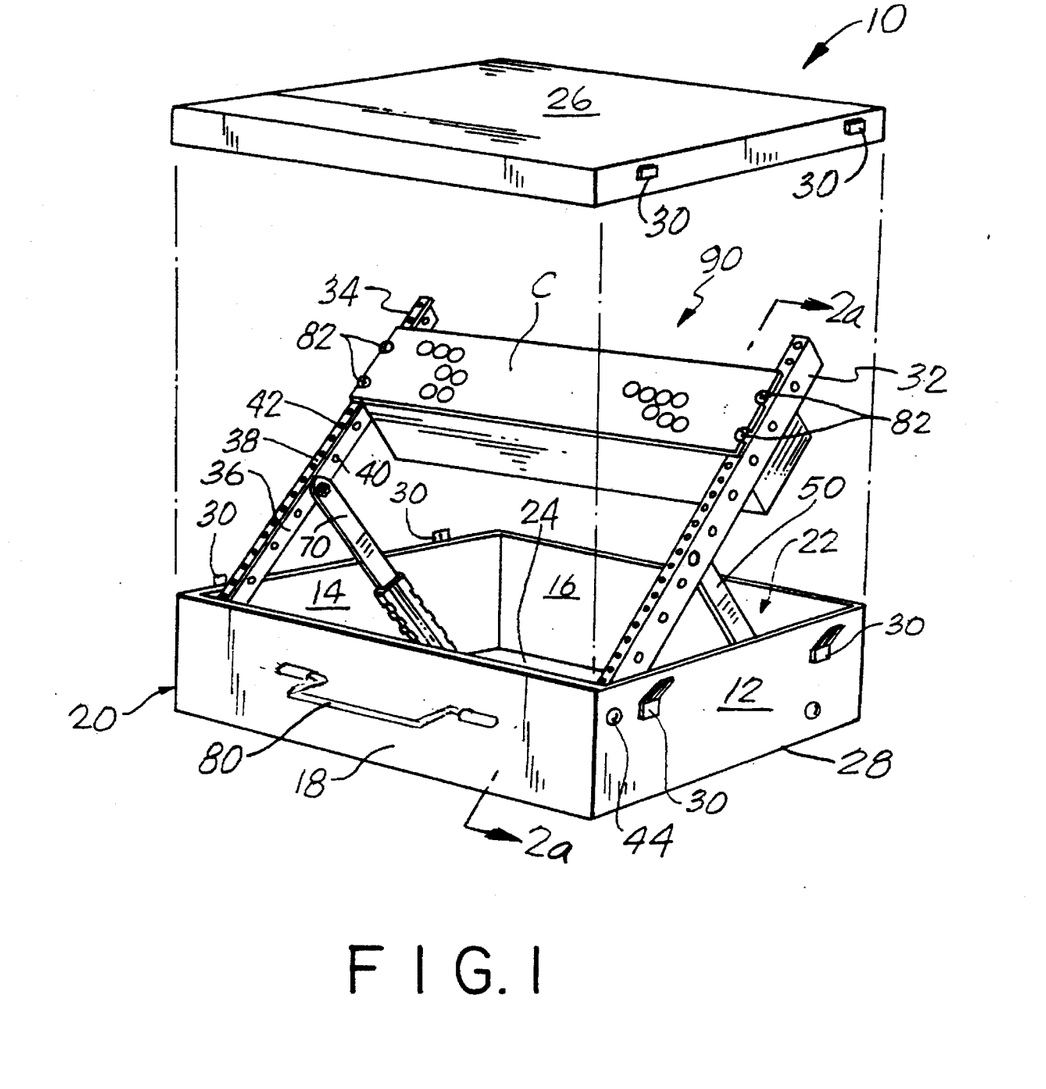
FIG. 1 is a perspective view of a rack mounting system in accordance with one embodiment of the present invention, showing the cover in an unassembled condition and the rack assembly in an extended position.
Figure 2:
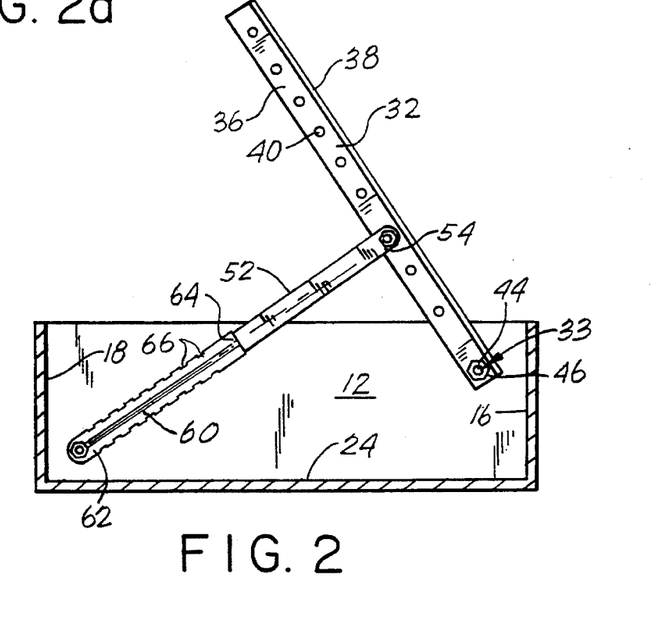
FIG. 2 is cross-sectional view taken along line 2—2 of FIG. 1.
Figure 2A:
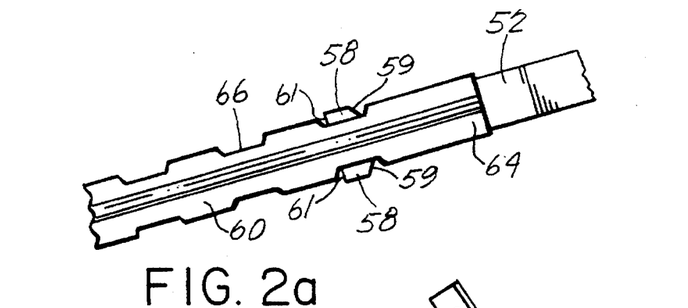
FIG. 2a is an enlarged detailed view of the slide member as used in the present invention.
Figure 3:
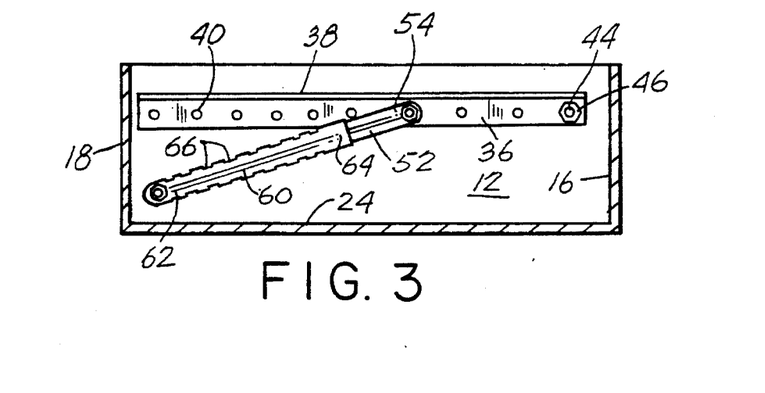
FIG. 3 is the same cross-sectional view shown in FIG. 2, with the rack assembly in the retracted position.

Referring to FIGS. 1–3, there is illustrated a preferred embodiment of a rack mounting system 10 in accordance with one embodiment of the present invention. Generally, rack mounting system 10 includes a pair of opposed side panels 12, 14 which are joined by a pair of opposed end panels 16, 18 to form a rectangular frame structure 20. Frame structure 20 defines a storage space 22 having front and rear access openings which typically lie in planes that are parallel to one another. The rear access opening to storage space 22 may be enclosed by a rear panel 24 fixedly secured to frame structure 20 to define an open box 28. Optionally, the front access opening to storage space 22 may be enclosed by a removable cover 26 to fully enclose box 28 for protecting the electronic components in storage space 22, particularly when box 28 is of a portable size and can be used to transport the components therein to remote locations. In one such arrangement, shown in FIG. 1, cover 26 may be connected to frame structure 20 by a series of latch elements 30, the mating portions of which are mounted along the free edges of side panels 12 and 14 and the corresponding free edges of cover 26 so that cover 26 may be entirely removed from frame structure 20. Alternatively, cover 26 may be hingedly connected along one edge to a free edge of frame structure 20, with one or more of latch elements 30 being used to hold the cover in the closed condition.

Mounted in the interior of box 28 are a pair of rack rails 32 and 34 which are of the type commonly used for mounting electronic components in a stacked relationship. Rack rails 32 and 34 are mounted independently of one another such that they only become connected to one another upon the assembly of one or more electronic components therebetween. Generally, rack rails 32 and 34 are elongated steel L-shaped brackets having a wide leg 36 and a narrow leg 38. A series of apertures 40 may be spaced along the length of wide leg 36 for mounting the rack rail to a frame or other support structure. The narrow leg 38 typically includes a plurality of threaded apertures 42 spaced apart according to electronic industry standards to accept electronic components for mounting. Most commonly, the centers of adjacent threaded apertures 42 are spaced apart by $\frac{5}{8}$", $\frac{5}{8}$" and $\frac{1}{2}$" in a repeating pattern. According to industry standards, rack rails 32 and 34 are separated from one another by a spaced distance of a sufficient dimension as to be able to accept substantially every electronic component designed for rack mounting. With respect to electronic components in the audio/video industry, this spaced distance is between about 18 inches and about 20 inches; and more particularly is about 19 inches.

One end of rack rail 32 is mounted at attachment point 33 to side panel 12, such as by bolt 44 and nut 46, so that the rack rail can pivot into and out from storage space 22. The attachment point 33 is selected so that, in the retracted position shown in FIG. 3, rack rail 32 will lie entirely within box 28, preferably adjacent the front access opening to storage space 22, and in the fully extended position, as shown in FIG. 2, substantially the entirety of the rack rail will protrude outwardly of box 28. Most preferably, rack rail 32 in the retracted position will lie just inwardly of the front access opening to storage space 22 so that box 28 can be enclosed by cover 26 without interfering with any knobs, buttons or switches protruding from the front panels of the electronic components mounted in rack mounting assembly 10. Rack rail 34 is mounted to box 28 in a similar fashion, with one end mounted at an attachment point (not shown) to side panel 14 so that rack rail 34 lies entirely within the box 28 adjacent the front access opening to storage space 22 in the retracted position shown in FIG. 3, and so that substantially the entirety of rack rail 34 will project outwardly of box 28 in the fully extended position shown in FIG. 2.

Rack mounting system 10 further includes a pair of slide members 50 and 70 which support rack rails 32 and 34, respectively, in the retracted position, and which lock rack rails 32 and 34 in the extended position and at a selected one of a plurality of predetermined angular positions intermediate the retracted and extended positions. Slide members 50 and 70 have identical structures; therefore, for purposes of the present description, the structure of only slide member 50 will be discussed in full detail below. These slide members 50 and 70 may be any commercially available devices capable of locking rack rails 32 and 34 at discrete angular positions. A particularly useful slide member in this regard is an eight position telescoping slide manufactured by Lanz Industrie Technik AG of CH-4855, Wolfwil, Switzerland.

It will be appreciated that, for relatively small rack mounting systems designed for mounting only a few electronic components, it may be possible to use only a single slide member connected to one of the rack rails. The remaining rack rail will then be freely movable between the retracted and extended positions, but, as a result of its connection through the electronic components to the first rack rail, will ordinarily be held in place in the intermediate angular position in which the first rack rail is locked. In those embodiments in which a slide member 50 is connected to only a single one of the rack rails, a stop member (not shown) is preferably provided on the side panel to which the remaining rack rail is mounted to help support the rack rail and the components mounted thereto in the retracted position.

Referring to FIG. 3, slide member 50 includes one arm 52 which is telescopically received in sliding engagement in a hollow arm 60. One end 54 of arm 52 is pivotally connected to rack rail 32, and the other end carries a pair of spring-loaded engagement members 58 biased to an extended position. Hollow arm 60, in turn, is pivotally connected at one end 62 to side panel 12 and has a free end 64 for telescopically receiving the end of arm 52 carrying engagement members 58. A plurality of pairs of notches 66 formed along the longitudinal side edges of hollow arm 60 are sized for receiving engagement members 58 to define the various positions at which arm 52 can be locked in place with respect to hollow arm 60. Engagement members 58 have tapered rear edges 59 which act as camming surfaces to push engagement members 58 inwardly and release same from notches 66 as arm 52 is pulled out from hollow arm 60. The front edges 61 of engagement members 58, however, define surfaces which are oriented for engaging the edges of notches 66 in the extended position of the engagement members so as to prevent the movement of arm 52 in the opposite direction into hollow arm 60.

The following will detail the typical use of a portable rack mounting system 10 for mounting and transporting electronic audio and video components. In those instances in which rack mounting system 10 is designed to be portable, box 28 may be provided with a handle 80 or other device so that rack mounting system 10 may be lifted for carrying. Additionally, to facilitate the transport of rack mounting system 10, box 28 may be provided with a set of casters (not shown) on one or more surfaces thereof.

In a typical arrangement, the various audio and video components to be mounted in rack mounting system 10 are organized in a desired configuration in storage space 22 with the front panels of the components facing outwardly. These components may then be assembled to rack rails 32 and 34, such as by threaded fasteners 82. This procedure is most easily accomplished with the rack rails in the fully retracted position so that the components can be supported by the rack rails during assembly. FIG. 1 shows one component C assembled in this fashion to rails 32 and 34 to define a rack assembly 90 which may be moved as a unit with respect to frame structure 20.

At any point during the process of mounting the components to rack rails 32 and 34, access to the rear of the components can be obtained by lifting the free ends of rack rails 32 and 34, thereby pivoting rack assembly 90 outwardly from storage space 22. Lifting the free ends of rack rails 32 and 34 will cause arm 52 of slide member 50 to begin sliding outwardly from hollow arm 60, as a result of which arm 52 and hollow arm 60 will pivot in opposite directions. The same movement will, of course, take place with respect to the telescoping arms of slide member 70. This sliding movement will continue until engagement members 58 become engaged in the first pair of notches 66 which will define a first angular position at which the rack assembly 90 can be locked in place. If a greater angular position with respect to the opening to storage space 22 is desired, rack assembly 90 may be lifted further until engagement members 58 engage the next pair of notches 66 in outer arm 60 or a pair of notches 66 subsequent thereto, at which point rack assembly 90 will be locked in the desired angular position. When rack assembly 90 has been lifted to a large angle with respect to the opening to storage space 22, the rear panels of the audio/video components mounted to rack rails 32 and 34 will be completely accessible so that electrical interconnections between the various components can be made. Rack assembly 90 may be tilted to this angular position at any time these electrical interconnections need to be modified or maintenance or repair functions need to be performed on the components.

In order to lower rack assembly 90 from its locked engagement in any angular position, the rack assembly must first be pivoted beyond the fully extended position of rack rails 32 and 34 to a release position in which slide member 50 has been extended to its maximum length. This length is defined by interfering members (not shown) positioned adjacent the free ends of arm 52 and hollow arm 60 which prevent these arms from being entirely disengaged from one another. In any event, lifting rack assembly 90 beyond the fully extended position of rack rails 32 and 34 locks engagement members 58 in a retracted position so that their rear edges 61 will not engage the edges of notches 66 and so that arm 52 can thus slide in a reverse direction into hollow arm 60. Since this occurs only when rack assembly 90 has first been lifted to the release position, this acts as a safety mechanism to prevent the accidental release of the rack assembly which could potentially damage the electrical components mounted thereon.

In addition to providing access to the rear panels of the electrical components mounted to rack rails 32 and 34, the ability to lock rack assembly 90 in an angular position with respect to the opening to storage space 22 provides several important advantages. Most notable of these is the ability to position the rack assembly at an appropriate angle which is most desirable for viewing. Thus, when rack mounting assemblies of a traditional construction are positioned for use on the floor, depending upon the orientation of the rack mounting assembly, the front panels of the electrical components mounted therein will face either upwardly in which case they can best be viewed from directly overhead, or will face out toward one side, in which case they can best be viewed from a vantage point either at a distance from the rack mounting system or very close to the floor. In either case, the front panels of the electronic components can only be viewed with difficulty. Viewing the front panels of the electronic components is made much easier, however, with the rack mounting system 10 of the present invention, wherein rack assembly 90 can be lifted and locked into place at one of a plurality of angular positions at which viewing will be most comfortable.

Rack mounting assembly 10 in accordance with the present invention also provides advantages in terms of size and portability. In this regard, the ability to pivot the electronic components mounted to rack rails 32 and 34 out from storage space 22 eliminates the need to increase the depth of box 28 so as to provide room for such access. Hence, box 28 may be made smaller and less bulky, facilitating its portability. Furthermore, since there is no need for a removable rear panel in rack mounting assembly 10, manufacturing costs can be reduced.

Figure 4:
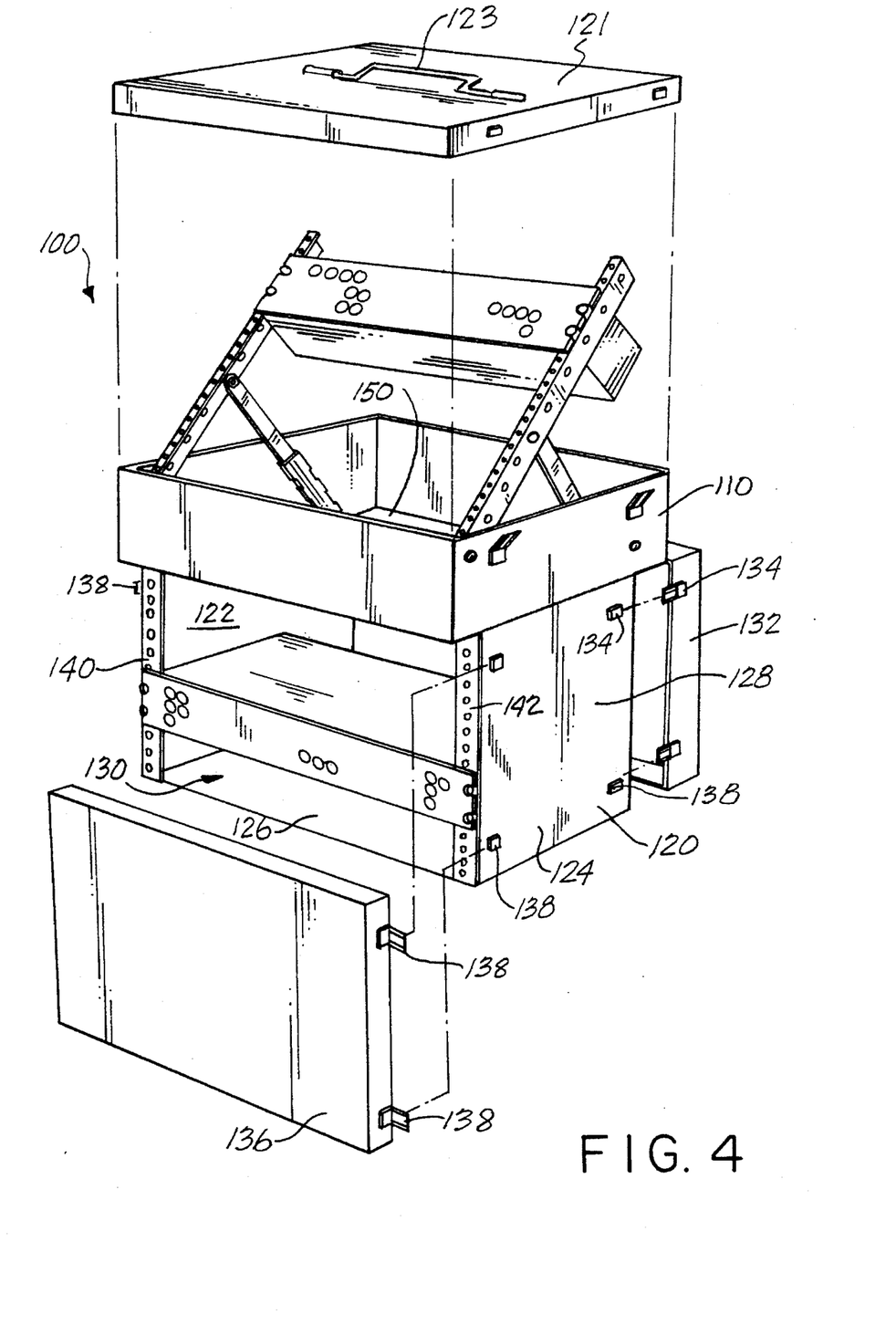
FIG. 4 is a perspective view of a rack mounting system in accordance with another embodiment of the present invention, showing the various covers therefor in the unassembled position.

An alternate embodiment of a rack mounting system 100 in accordance with the present invention is shown in FIG. 4. Rack mounting system 100 consists of an upper rack unit 110 which is arranged in a generally horizontal orientation atop a lower rack unit 120 arranged in a generally vertical orientation. Lower rack unit 120 is a conventional rack mounting cabinet having a pair of side panels 122, 124 joined by a lower panel 126 and an upper panel (not shown) to form a rectangular cabinet 128 around a storage compartment 130. Storage compartment 130 has front and rear access openings which ordinarily lie in planes that are parallel to one another. A removable rear cover 132 may be provided for enclosing the rear access opening to storage compartment 130, rear cover 132 being connectable to cabinet 128 by a series of latch elements 134 arranged along the free rear edges of side panels 122 and 124 and the corresponding free edges of rear cover 132. Similarly, a removable front cover 136 may be provided for enclosing the front access opening to storage compartment 130, front cover 136 being connectable to cabinet 128 by a series of latch elements 138 arranged along the free front edges of side panels 122 and 124 and the corresponding free edges of front cover 136.

Mounted in the interior of cabinet 128 adjacent the front access opening to storage compartment 130 are a pair of rack rails 140 and 142 having substantially the identical structure as discussed above in connection with rack rails 32 and 34. In the case of lower rack unit 120, however, rack rails 140 and 142 are ordinarily mounted to the side panels at more than a single attachment point so that the position and orientation of the rack rails is fixed with respect to cabinet 128.

Upper rack unit 110 has in all respects substantially the same construction as rack mounting system 10 discussed above, with the exception that the rear panel of upper rack unit 110 includes an opening 150 which provides communication between the interior storage space in upper rack unit 110 and storage compartment 130 in lower rack unit 120. A cover 121 removably connectable to upper rack unit 110 may be provided with a handle 123 to facilitate the lifting and carrying of rack mounting assembly 100. Optionally, rack mounting system 100 may be provided with a set of casters (not shown) on the bottom of lower rack unit 120 to increase portability.

The arrangement of upper rack unit 110 and lower rack unit 120 to form rack mounting system 100 provides numerous advantages over conventional rack mounting systems. Firstly, rack mounting system 100 provides an economy of size over conventional rack mounting systems capable of storing the same number of electronic components. By way of explanation, lower rack unit 120 may be sized to receive six electronic components in stacked relationship, and upper rack unit 110 may be sized to receive ten electronic components in stacked relationship so that rack mounting system 100 is capable of receiving a total of sixteen electronic components. A conventional rack mounting system which mounts each of the electronic components in sequence one atop the next would have to be more than twice the height of rack unit 120 to accommodate the same number of electronic components, resulting in a rack mounting system which is difficult to carry and transport. However, mounting upper rack unit 110 in a substantially perpendicular orientation to lower rack unit 120 takes advantage of the depth added to lower rack unit 120 by covers 132 and 136 and results in a rack mounting system 100 which can accommodate all of the electronic components in an apparatus having a much lower overall height and a reduced overall volume. Moreover, by lifting the rack assembly of upper rack unit 110 outwardly to the extended position or to an intermediate angular position, all of the electronic components mounted in both upper rack unit 110 and lower rack unit 120 may be viewed simultaneously from a single vantage point.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as set forth in the appended claims.

I claim:

1. An apparatus for mounting electronic components, comprising a housing defining a cavity and a front opening to said cavity lying in a preselected opening plane, rail means for mounting electronic components to said housing, said rail means being connected to said housing for pivotal movement relative to said housing about an axis extending parallel to said opening plane between a retracted position in which said rail means lie entirely within said housing and an extended position in which said rail means project out from said housing at an angle to said opening plane, fastening means for fastening the electronic components to said rail means, and an operating mechanism including means for locking said rail means in said extended position and for releasing said rail means for movement to said retracted position.

2. The apparatus as claimed in claim 1, wherein said rail means lie adjacent said opening plane in said retracted position.

3. The apparatus as claimed in claim 1, wherein said rail means includes first and second rail members connected to opposite sides of said housing and independently movable about first and second axes between said retracted and extended positions.

4. The apparatus as claimed in claim 3, wherein said first and second axes are aligned coaxially.

5. The apparatus as claimed in claim 3, wherein said first and second rail members are spaced apart by a standard distance for receiving electronic audio and video components therebetween.

6. The apparatus as claimed in claim 5, further comprising handle means for carrying said housing from one location to another.

7. The apparatus as claimed in claim 1, wherein said fastening means include a plurality of threaded apertures positioned at preselected spaced intervals along a length of said rail means.

8. The apparatus as claimed in claim 1, wherein said rail means is movable to a release position beyond said extended position, said operating mechanism further including means for releasing said rail means for movement to said retracted position only from said release position.

9. The apparatus as claimed in claim 1, wherein said operating mechanism further includes means for locking said rail means at one of a plurality of discrete angular positions intermediate said extended and retracted positions.

10. The apparatus as claimed in claim 9, wherein said rail means is movable to a release position beyond said extended position, said operating mechanism further including means for releasing said rail means for movement to said retracted position only from said release position.

11. The apparatus as claimed in claim 1, wherein said operating mechanism includes a first arm having one end pivotally connected to said housing and a free end, a second arm having one end pivotally connected to said rail means and a free end, said first and second arms being connected for sliding movement relative to one another between a retracted condition when said rail means is in said retracted position and an extended condition when said rail means is in said extended position.

12. The apparatus as claimed in claim 11, wherein said operating mechanism further includes means for locking said first arm relative to said second arm at one of a plurality of discrete conditions intermediate said extended and retracted conditions.

13. The apparatus as claimed in claim 1, wherein said housing further defines a rear opening to said cavity, said apparatus further comprising a rear panel for enclosing said rear opening.

14. The apparatus as claimed in claim 13, further comprising a cover connectable to said housing over said front opening to fully enclose said cavity.

15. The apparatus as claimed in claim 1, further comprising handle means for carrying said housing from one location to another.

16. An apparatus for mounting electronic components, comprising a first housing defining a storage space and a front opening to said storage space lying in a predetermined opening plane, mounting means for mounting one portion of the electronic components to said first housing, a second housing connected to said first housing and defining a cavity and an opening to said cavity lying in a preselected opening plane, rail means for mounting electronic components to said second housing, said rail means being connected to said second housing for pivotal movement relative to said second housing about an axis extending parallel to said preselected opening plane between a retracted position in which said rail means lie entirely within said second housing and an extended position in which said rail means project out from said second housing at an angle to said preselected opening plane, fastening means for fastening another portion of the electronic components to said rail means, and an operating mechanism including means for locking said rail means in said extended position and for releasing said rail means for movement to said retracted position.

17. The apparatus as claimed in claim 16, wherein said rail means lie adjacent said preselected opening plane in said retracted position.

18. The apparatus as claimed in claim 16, further comprising passage means for providing communication between said storage space and said cavity.

19. The apparatus as claimed in claim 16, wherein said preselected opening plane is oriented at an angle to said predetermined opening plane.

20. The apparatus as claimed in claim 19, wherein said angle is about 90°.

21. The apparatus as claimed in claim 16, wherein said mounting means includes a pair of rail members connected to opposite sides of said first housing adjacent said predetermined opening plane, and assembling means for assembling the one portion of the electronic components to said pair of rail members.

22. The apparatus as claimed in claim 16, wherein said rail means includes first and second rail members connected to opposite sides of said second housing and independently movable about first and second axes between said retracted and extended positions.

23. The apparatus as claimed in claim 22, wherein said first and second rail members are spaced apart by a standard distance for receiving electronic audio and video components therebetween.

24. The apparatus as claimed in claim 23, further comprising handle means for carrying said first and second housings together from one location to another.

25. The apparatus as claimed in claim 16, wherein said rail means is movable to a release position beyond said extended position, said operating mechanism further including means for releasing said rail means for movement to said retracted position only from said release position.

26. The apparatus as claimed in claim 16, wherein said operating mechanism includes means for locking said rail means at one of a plurality of discrete angular positions intermediate said extended and retracted positions.

27. The apparatus as claimed in claim 26, wherein said rail means is movable to a release position beyond said extended position, said operating mechanism further including means for releasing said rail means for movement to said retracted position only from said release position.

28. The apparatus as claimed in claim 16, wherein said operating mechanism includes a first arm having one end pivotally connected to said second housing and a free end, a second arm having one end pivotally connected to said rail means and a free end, said first and second arms being connected for sliding movement relative to one another between a retracted condition when said rail means is in said retracted position and an extended condition when said rail means is in said extended position.

29. The apparatus as claimed in claim 28, wherein said operating mechanism further includes means for locking said first arm relative to said second arm at one of a plurality of discrete conditions intermediate said extended and retracted conditions.

30. The apparatus as claimed in claim 16, wherein said first housing further defines a rear opening to said storage space, said apparatus further comprising a front member connectable to said first housing over said front opening, and a rear member connectable to said first housing over said rear opening.

31. The apparatus as claimed in claim 30, further comprising a cover connectable to said second housing over said opening to fully enclose said cavity.

32. The apparatus as claimed in claim 16, further comprising handle means for carrying said first and second housings together from one location to another.

* * * * *

UNITED STATES PATENT AND TRADEMARK OFFICE
CERTIFICATE OF CORRECTION

PATENT NO. : B1 5,452,951
DATED : Nov. 18, 1997
INVENTOR(S) : Peller

It is certified that error appears in the above-identified patent and that said Letters Patent is hereby corrected as shown below:

On the Title Page, after *"Primary Examiner* - Peter M. Cuomo" insert
--*Attorney, Agent or Firm* - Lerner, David, Littenberg, Krumholz & Mentlik--.

Signed and Sealed this

Twenty-sixth Day of May, 1998

Attest:

BRUCE LEHMAN

*Attesting Officer*   Commissioner of Patents and Trademarks

REEXAMINATION CERTIFICATE (3384th)

United States Patent [19]

Peller

[11] B1 5,452,951

[45] Certificate Issued Nov. 18, 1997

[54] ELECTRONIC COMPONENT RACK

[75] Inventor: Hyman H. Peller, Upper Montclair, N.J.

[73] Assignee: Raxxess Metalsmiths Inc., Prospect Park, N.J.

Reexamination Request:
No. 90/004,392, Sep. 23, 1996

Reexamination Certificate for:
Patent No.: 5,452,951
Issued: Sep. 26, 1995
Appl. No.: 183,473
Filed: Jan. 18, 1994

[51] Int. Cl.$^6$ .................................................. A47B 88/00
[52] U.S. Cl. ........................... 312/310; 312/223.1; 108/6; 248/461
[58] Field of Search .................................... 312/310, 324, 312/327, 293.1, 293.2; 108/1, 6, 9, 33, 39; 248/455, 456, 461

[56] References Cited

U.S. PATENT DOCUMENTS

| | | |
|---|---|---|
| 257,285 | 5/1882 | Brownell . |
| 895,972 | 8/1908 | Dana . |
| 2,244,036 | 6/1941 | Williman et al. . |
| 2,515,474 | 7/1950 | Ryder . |
| 2,566,064 | 8/1951 | Keim . |
| 2,730,322 | 1/1956 | Haberland et al. . |
| 2,739,859 | 3/1956 | Cohen . |
| 2,778,705 | 1/1957 | Barker . |
| 2,804,122 | 8/1957 | Baum . |
| 3,001,102 | 9/1961 | Stiefel . |
| 3,164,353 | 1/1965 | Rene . |
| 3,420,381 | 1/1969 | Bradfield . |
| 4,350,098 | 9/1982 | Shirono . |
| 4,421,943 | 12/1983 | Withjack . |
| 4,592,285 | 6/1986 | Egli . |
| 4,660,791 | 4/1987 | Lisak . |
| 5,097,386 | 3/1992 | Byell et al. . |
| 5,117,986 | 6/1992 | Lin . |
| 5,245,527 | 9/1993 | Duff et al. . |

OTHER PUBLICATIONS

Catalog (1993) from Clearwave Audio Technologies, Inc. (A).
Catalog (1990) from Starcase Manufacturing Co., Inc. (A).
Commercial Products Catalog (1992), Middle Atlantic Produce–Front and back cover pages, p. 6(B).
Shop drawing (1989) for custom manufacture from Grundof Mfg. (A).

*Primary Examiner*—Peter M. Cuomo

[57] ABSTRACT

An apparatus for rack mounting electronic components includes a frame structure defining a storage compartment having a front access opening and a pair of rack rails pivotally mounted to opposite sides of the frame structure for movement between a retracted position in which the rack rails lie entirely within the frame structure and an extended position in which the rack rails project out from the frame structure. Connected between the rack rails and the sides of the frame structure are slide members which are capable of locking the rack rails at the extended position and at a number of discrete angular positions intermediate the extended and retracted positions. With electronic components mounted to the rack rails, pivoting the rack rails from the retracted position to the extended position will provide access to the rear panels of the these components to facilitate the completion of electrical interconnections and maintenance and repair procedures.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 19, 20 are confirmed.

Claims 1-16 are cancelled.

Claims 17, 18, 21, 22, 25, 26, 28, 30 and 32 are determined to be patentable as amended.

Claims 23, 24, 27, 29 and 31, dependent on an amended claim, are determined to be patentable.

17. The apparatus as claimed in claim [16] *19*, wherein said rail means lie adjacent said preselected opening plane in said retracted position.

18. The apparatus as claimed in claim [16] *19*, further comprising passage means for providing communication between said storage space and said cavity.

19. The apparatus as claimed in claim 16, wherein said preselected opening plane is oriented at an angle to said predetermined opening plane.

21. The apparatus as claimed in claim [16] *19*, wherein said mounting means includes a pair of rail members connected to opposite sides of said first housing adjacent said predetermined opening plane, and assembling means for assembling the one portion of the electronic components to said pair of rail members.

22. The apparatus as claimed in claim [16] *19*, wherein said rail means includes first and second rail members connected to opposite sides of said second housing and independently movable about first and second axes between said retracted and extended positions.

25. The apparatus as claimed in claim [16] *19*, wherein said rail means is movable to a release position beyond said extended position, said operating mechanism further including means for releasing said rail means for movement to said retracted position only from said release position.

26. The apparatus as claimed in claim [16] *19*, wherein said operating mechanism includes means for locking said rail means at one of a plurality of discrete angular positions intermediate said extended and retracted positions.

28. The apparatus as claimed in claim [16] *19*, wherein said operating mechanism includes a first arm having one end pivotally connected to said second housing and a free end, a second arm having one end pivotally connected to said rail means and a free end, said first and second arms being connected for sliding movement relative to one another between a retracted condition when said rail means is in said retracted position and an extended condition when said rail means is in said extended position.

30. The apparatus as claimed in claim [16] *19*, wherein said first housing further defines a rear opening to said storage space, said apparatus further comprising a front member connectable to said first housing over said front opening, and a rear member connectable to said first housing over said rear opening.

32. The apparatus as claimed in claim [16] *19*, further comprising handle means for carrying said first and second housings together from one location to another.

* * * * *